(12) United States Patent
Seo (10) Patent No.: US 8,129,251 B2
(45) Date of Patent: Mar. 6, 2012

(54) METAL-INSULATOR-METAL-STRUCTURED CAPACITOR FORMED WITH POLYSILICON

(75) Inventor: Won Sun Seo, Gyeonggi-do (KR)

(73) Assignee: Hynix Semiconductor Inc., Icheon-si (KR)

(*) Notice: Subject to any disclaimer, the term of this patent is extended or adjusted under 35 U.S.C. 154(b) by 976 days.

(21) Appl. No.: 11/595,985

(22) Filed: Nov. 13, 2006

(65) Prior Publication Data

US 2007/0284641 A1 Dec. 13, 2007

(30) Foreign Application Priority Data

May 25, 2006 (KR) .................. 10-2006-0047084

(51) Int. Cl.
*H01L 21/20* (2006.01)
(52) U.S. Cl. ........ 438/396; 438/397; 438/398; 438/253; 438/254; 438/255; 257/296; 257/303; 257/306; 257/309; 257/E21.012; 257/E21.019; 257/E21.648; 257/E21.649; 257/E21.655; 257/E27.088
(58) Field of Classification Search .......... 25/296, 25/303, 306–309, E21.012–E21.019, E21.648, 25/E21.649, E21.655, E21.657, E27.088; 438/396–398, 23–255
See application file for complete search history.

(56) References Cited

U.S. PATENT DOCUMENTS 6,525,363 B1* 2/2003 Willer et al. .................. 257/309
2001/0023110 A1* 9/2001 Fukuzumi et al. ............ 438/396

FOREIGN PATENT DOCUMENTS

JP 2000-216356 8/2000
KR 2005-55325 6/2005

OTHER PUBLICATIONS

Korean Notice of Rejection for App. No. 10-2006-0047084; Sent Apr. 23, 2007.

* cited by examiner

*Primary Examiner* — Lynne Gurley
*Assistant Examiner* — Meiya Li
(74) *Attorney, Agent, or Firm* — Kilpatrick Townsend & Stockton LLP (57) ABSTRACT

A METAL-INSULATOR-METAL structured capacitor is formed with polysilicon instead of an oxide film as a sacrificial layer material that defines a storage electrode region. A MPS (Meta-stable Poly Silicon) process is performed to increase the surface area of the sacrificial layer that defines the storage electrode region and also increase the area of the storage electrode formed over sacrificial layer. This process results in increasing the capacity of the capacitor in a stable manner.

9 Claims, 8 Drawing Sheets

METAL-INSULATOR-METAL-STRUCTURED CAPACITOR FORMED WITH POLYSILICON

CROSS-REFERENCES TO RELATED APPLICATIONS

The present application claims priority to Korean patent application number 10-2006-0047084, filed on May 25, 2006, which is incorporated by reference in its entirety.

BACKGROUND OF THE INVENTION

The present invention generally relates to forming a Metal-Insulator-Metal structured capacitor with polysilicon instead of a conventional oxide film as a sacrificial layer material that defines a storage electrode region. During formation, a surface area of a sacrificial layer that defines a storage electrode region is increased by a Metal-stable Poly Silicon (hereinafter, referred to as "MPS") process which also increases the area of the storage electrode formed on the sacrificial layer to increase capacity of the capacitor in a stable manner.

In a process for forming a capacitor of a semiconductor device, an oxide film is used as a sacrificial layer for forming a storage electrode.

FIGS. 1a through 1e are cross-sectional diagrams illustrating a method for forming a conventional Metal-Insulator-Metal capacitor.

Figure 1A:
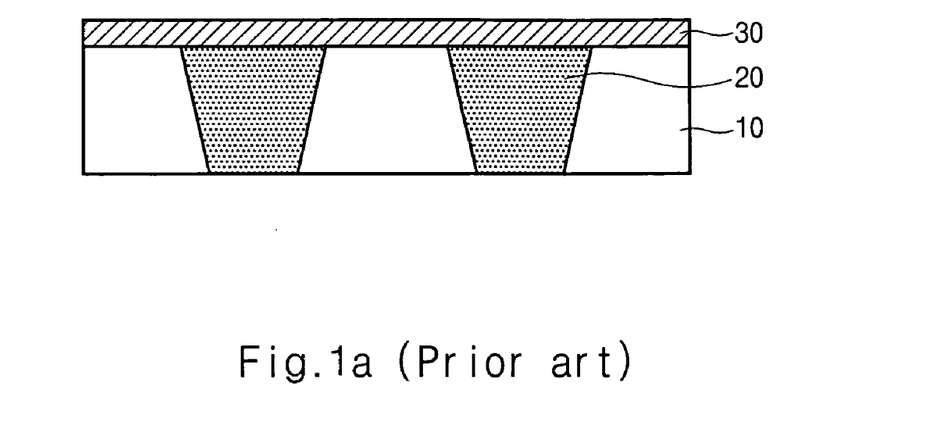
FIGS. 1a through 1e are cross-sectional diagrams illustrating a method for forming a conventional METAL-INSULATOR-METAL capacitor.

Referring to FIG. 1a, an interlayer insulating film 10 including a storage electrode contact plug 20 is formed over a semiconductor substrate (not shown). Then, an etching barrier film 30 is formed over the interlayer insulating film 10.

Figure 1B:
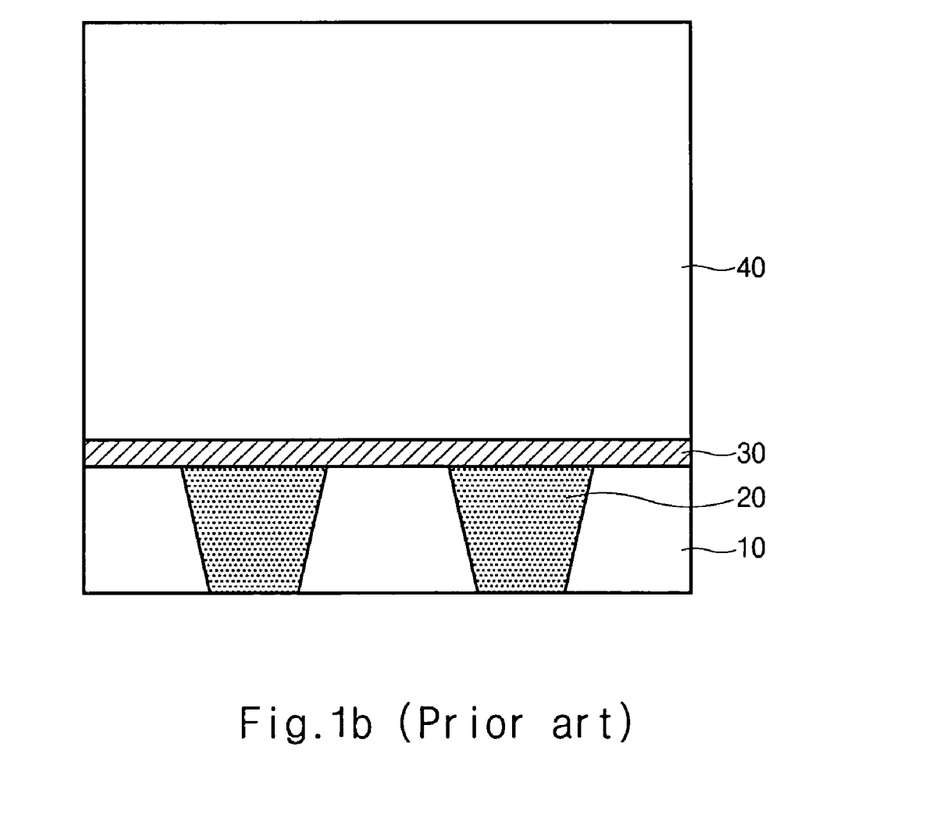

Referring to FIG. 1b, a sacrificial oxide film 40 for forming a storage electrode is formed over the etching barrier film 30.

Figure 1C:
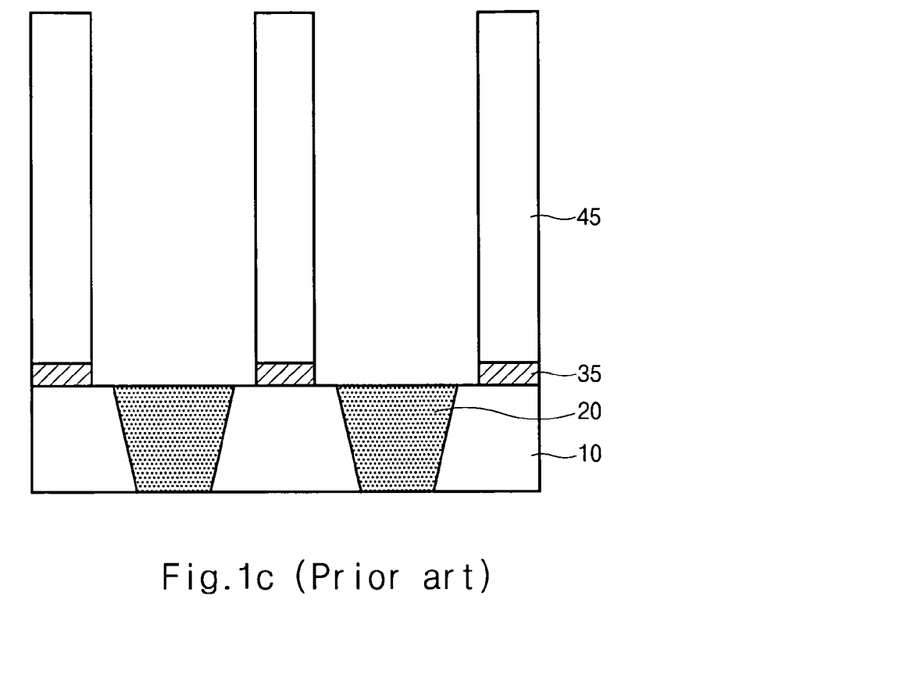

Referring to FIG. 1c, the sacrificial oxide film 40 and the etching barrier film 30 are etched with a photoresist pattern that defines a storage electrode region to form a sacrificial oxide film pattern 45 that defines the storage electrode region and a barrier film pattern 35.

Figure 1D:
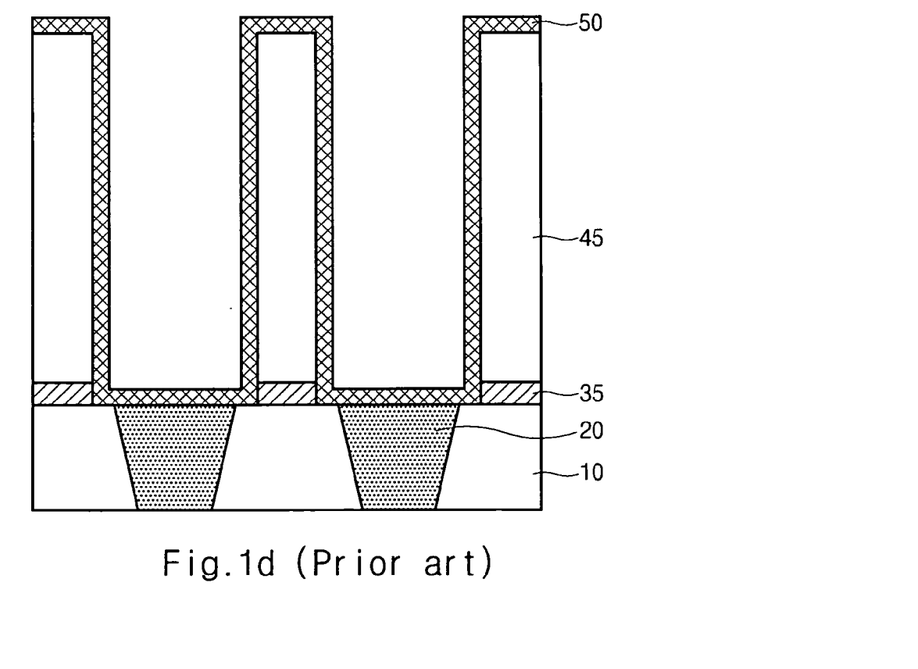

Referring to FIG. 1d, a storage electrode material 50 is formed over the semiconductor substrate including the sacrificial oxide film pattern 45.

Figure 1E:
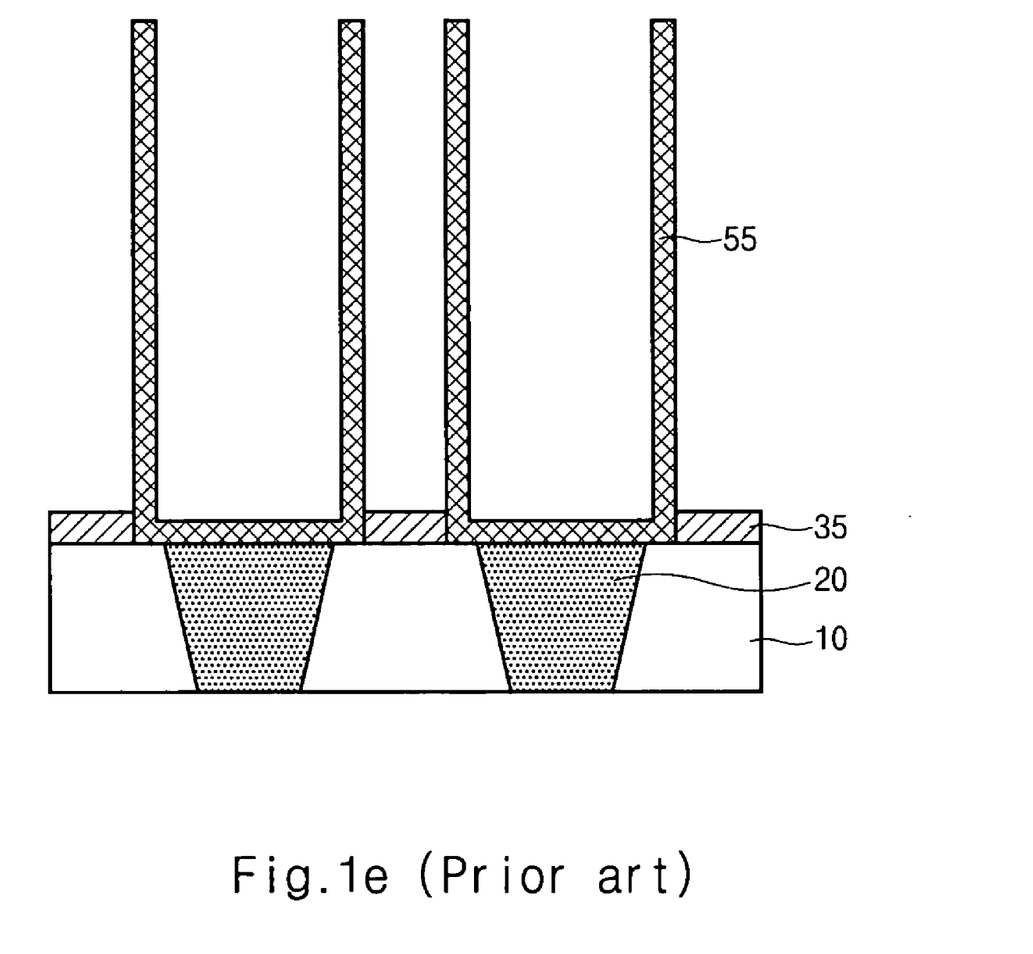

Referring to FIG. 1e, a CHEMICAL MECHANICAL POLISHING process is performed to remove the storage electrode material 50 formed over the sacrificial oxide film pattern 45 so that only one contact plug 20 is connected to each separated storage electrode 55.

A dielectric layer is formed over the semiconductor substrate including the storage electrode 55, and then a top electrode layer is formed over the semiconductor substrate to complete a capacitor.

As described above, the method for forming a METAL-INSULATOR-METAL capacitor using a sacrificial oxide film includes increasing the height of the sacrificial oxide film or introducing a new material having a high-k dielectric constant in order to increase the capacity of the capacitor since the area of the capacitor is decreased due to high integration of semiconductor devices.

However, when the sacrificial oxide film becomes higher, the process of etching a storage electrode region becomes unstable, and the storage electrode is collapsed or bridged so that the subsequent process of forming a capacitor is not normally performed. Also, it is difficult to introduce new materials.

SUMMARY OF THE INVENTION

Various embodiments are directed at providing a semiconductor device and a method for manufacturing the same that includes forming a storage electrode of a capacitor by a MPS process performed on a polysilicon pattern that defines a storage electrode region, and forming a metal storage electrode and a top electrode layer to secure the sufficient capacity of the capacitor and perform a capacitor forming process without collapsing the storage electrode, thereby increasing the yield of semiconductor devices.

According to an embodiment of the present invention, a semiconductor device comprises a storage electrode contact plug formed over a semiconductor substrate, and a three-dimensional storage electrode connected to the storage electrode contact plug. Here, the surface of the storage electrode is formed of a concavo-concave metal.

According to an embodiment of the present invention, a method for manufacturing a semiconductor device comprises the steps of: forming an interlayer insulating film including a storage electrode contact plug over a semiconductor substrate; forming an etching barrier film over the interlayer insulating film; exposing the storage electrode contact plug over the etching barrier film to form a polysilicon pattern that defines a cylinder-shaped storage electrode region; performing a Meta-stable Poly Silicon (hereinafter, referred to as "MPS") process so that the sidewall of the polysilicon layer is formed to be concavo-concave; forming a metal storage electrode layer over the semiconductor substrate and performing a CHEMICAL MECHANICAL POLISHING process to separate the metal storage electrode layer into a storage electrode connected to the storage electrode contact plug; and removing the polysilicon pattern to form a dielectric layer and a metal top electrode layer over the semiconductor substrate.

DETAILED DESCRIPTION OF THE EXEMPLARY EMBODIMENTS

The present invention will be described in detail with reference to the accompanying drawings.

Figure 2:
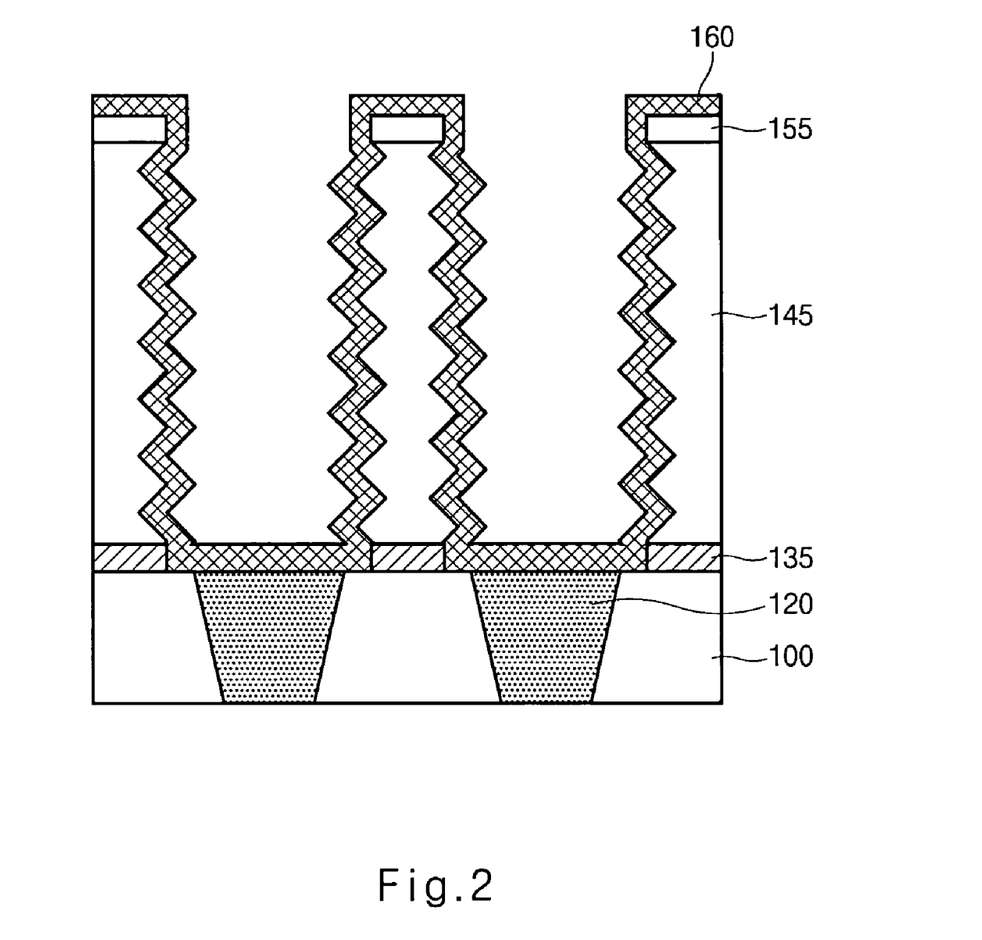
FIG. 2 is a cross-sectional diagram illustrating a semiconductor device according to an embodiment of the present invention.

FIG. 2 is a cross-sectional diagram illustrating a semiconductor device according to an embodiment of the present invention.

Referring to FIG. 2, an interlayer insulating film 100 including a storage electrode contact plug 120 is formed over a semiconductor substrate. Then, an etching barrier film pattern 135 is formed over the interlayer insulating film 100, and polysilicon patterns 145 and 155 that expose the storage electrode contact plug 120 are formed. Preferably, the polysilicon pattern has a deposition structure including a doped polysilicon layer (not shown) and an un-doped polysilicon layer 145 and a doped polysilicon layer 155 or a deposition structure including an un-doped polysilicon layer 145 and a doped polysilicon layer 155.

The doped polysilicon layer 155 prevents generation of defects when MPS removed from a subsequent CHEMICAL MECHANICAL POLISHING process serves as a particle.

Then, the MPS process is performed on the un-doped polysilicon layer 145 so that the cylinder-shaped sidewall surface area becomes concavo-concave. A metal storage electrode layer 160 is formed over the sidewalls of the polysilicon patterns 145 and 155 and over the surface of the storage electrode contact plug 120. The metal storage electrode layer 160 is formed of one metal selected from a group consisting of Ti/TiN, Ru, Pt and combinations thereof.

FIGS. 3a through 3g are cross-sectional illustrating a method for manufacturing a semiconductor device according to an embodiment of the present invention.

Figure 3A:
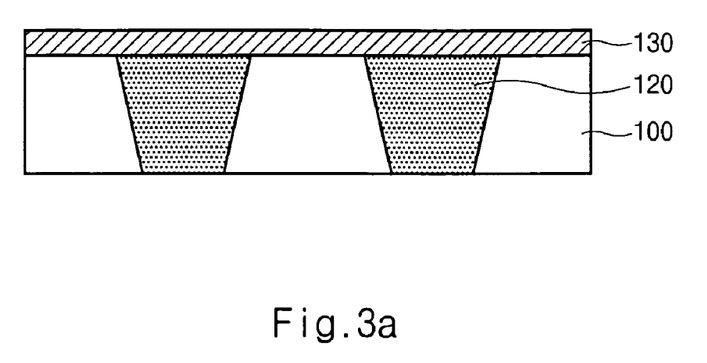
FIGS. 3a through 3g are cross-sectional illustrating a method for manufacturing a semiconductor device according to an embodiment of the present invention.

Referring to FIG. 3a, the interlayer insulating film 100 including the storage electrode contact plug 120 is formed over the semiconductor substrate (not shown). Here, a first interlayer insulating film is formed over the semiconductor substrate including gate, source/drain regions. Then, the first interlayer insulating film is selectively etched to form a landing plug contact hole including a first storage electrode contact hole and a bit line contact hole. Next, the landing plug contact hole is filled with a plug material, and a bit line formation process is performed to a second interlayer insulating film is formed over the semiconductor substrate. The second interlayer insulating film becomes the interlayer insulating film 100 of FIG. 3a. Thereafter, the interlayer insulating film 100 is partially etched to form a second storage electrode contact hole that exposes a first storage electrode contact plug of the landing plug, and the contact hole is filled with plug material. The second storage electrode contact plug becomes the storage electrode contact plug 120 of FIG. 2a.

An etching barrier film 130 is formed over the interlayer insulating film 100. The etching barrier film 130 prevents the contact plug and the bit line from being damaged by regulating the etching amount in a subsequent etching process for forming a storage electrode region. More preferably, the etching barrier film 130 performs an over-etching function to complete the etching process for forming the storage electrode region with a selectivity between an etching barrier nitride film and a polysilicon layer.

Figure 3B:
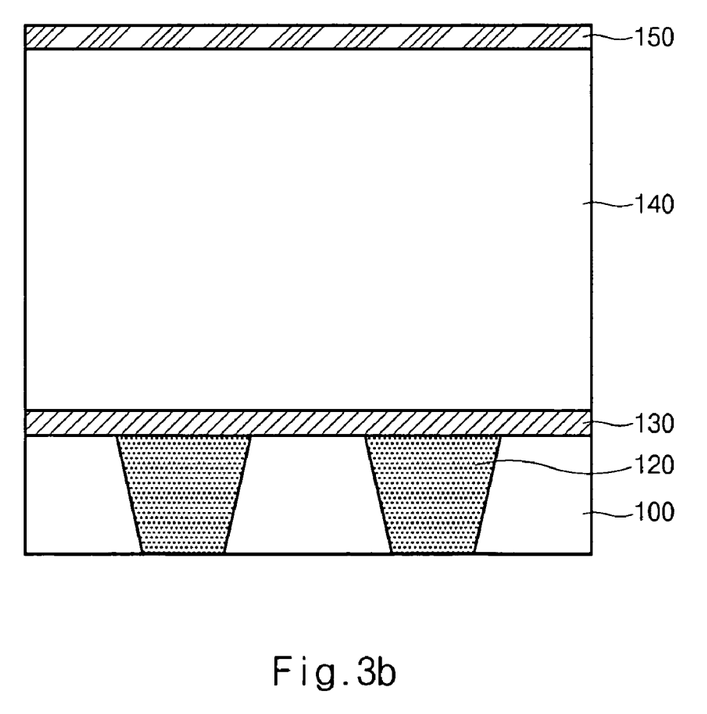

Referring to FIG. 3b, a first polysiliocn layer 140 for forming a capacitor storage electrode is formed over the etching barrier film 130, and a second polysilicon layer 150 is formed over the first polysilicon layer 140. The etching barrier film 130 is formed of a nitride film having a thickness ranging from 300 to 600 Å. The first polysilicon layer 140 is formed of an un-doped polysilicon layer having a thickness ranging from 14000 to 20000 Å to serve as a sacrificial layer for forming the storage electrode region. The second polysilicon layer 150 is formed of a doped polysilicon layer having a thickness ranging from 2000 to 3000 Å.

Figure 3C:
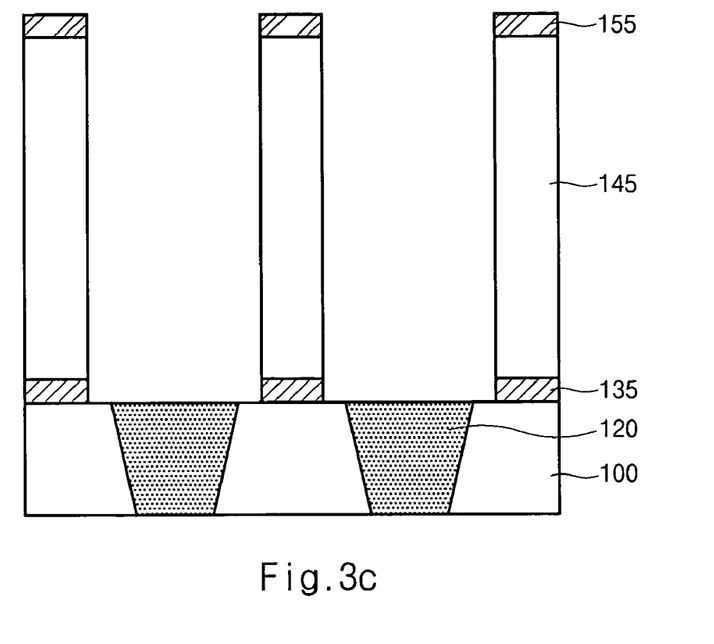

Preferring to FIG. 3c, a photoresist pattern (not shown) that exposes the storage electrode region is formed over the second polysilicon layer 150.

The second polysilicon layer 150 serves as a BARC (Bottom Anti-Relectrice Coating) and a hard mask when the process for etching the storage electrode region is performed even with a thin photoresist pattern. Preferably, the second polysilicon layer 150 is a doped polysilicon not to be affected by the subsequent MPS process.

The etching process is performed with a photoresist pattern that exposes the storage electrode region to etch the first and second polysilicon layers 140 and 150 and the etching barrier film 130 so that the etching barrier film 135, the first polysilicon pattern 145 and the second polysilicon pattern 155 are formed which define the storage electrode region.

Figure 3D:
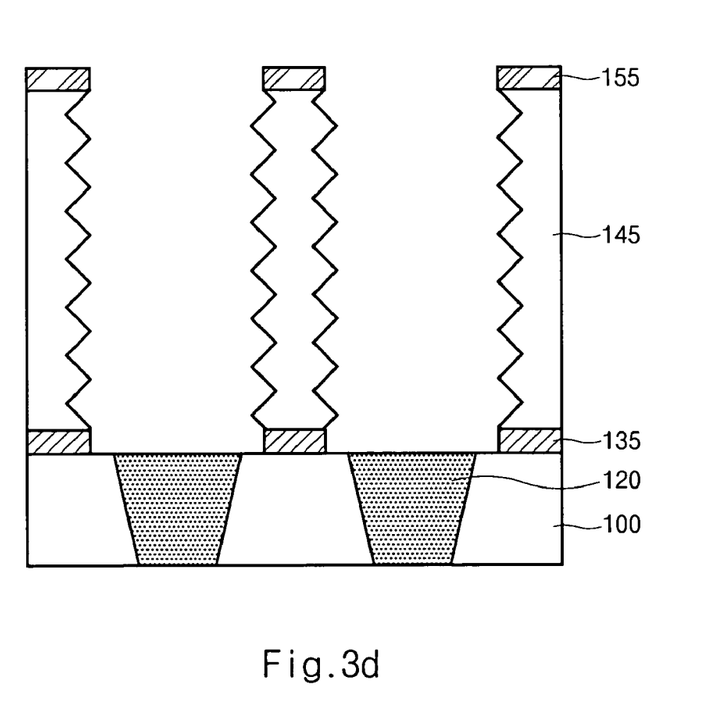

Referring to FIG. 3d, the MPS process is performed so that the sidewall of the first polysilicon layer becomes concavo-concave. When an annealing process is performed in a high vacuum state after seeding of silicon over an amorphous silicon film, the surface of the silicon film becomes concavo-concave by moving characteristic of silicon atoms. The method using the above-described characteristic is a MPS process. In this embodiment, the MPS process is performed on the first polysilicon pattern 145 that defines the storage electrode region in a METAL-INSULATOR-METAL structure having a metal electrode where a MPS process is not performed. Then, a metal storage electrode is formed so that MPS can be used in the METAL-INSULATOR-METAL structure. Preferably, the MPS process is performed until the surface area of the first polysilicon pattern 145 becomes maximum by 1.5~2.0 times.

Figure 3E:
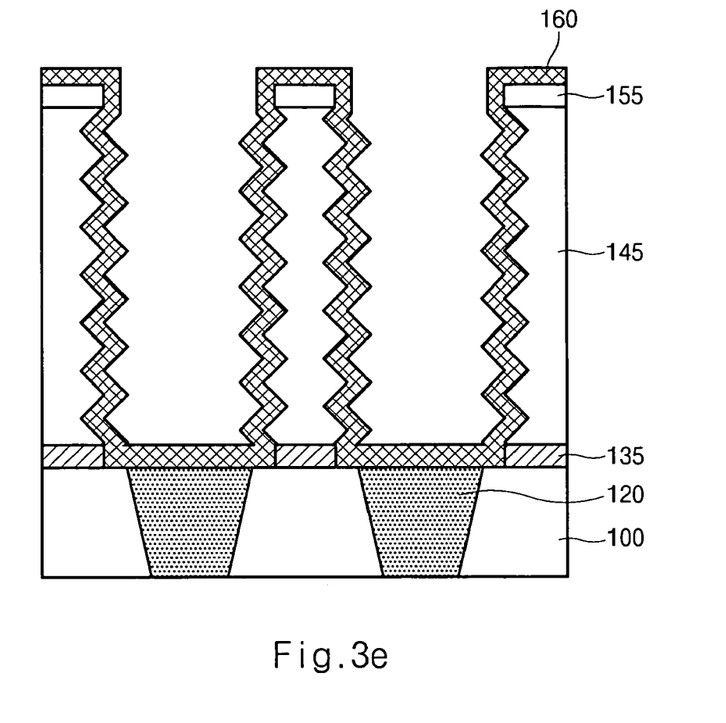

Referring to FIG. 3e, a storage electrode layer 160 is formed over the semiconductor substrate. The storage electrode layer is formed of one metal selected from a group consisting of Ti/TiN, Ru, Pt and combinations thereof.

Figure 3F:
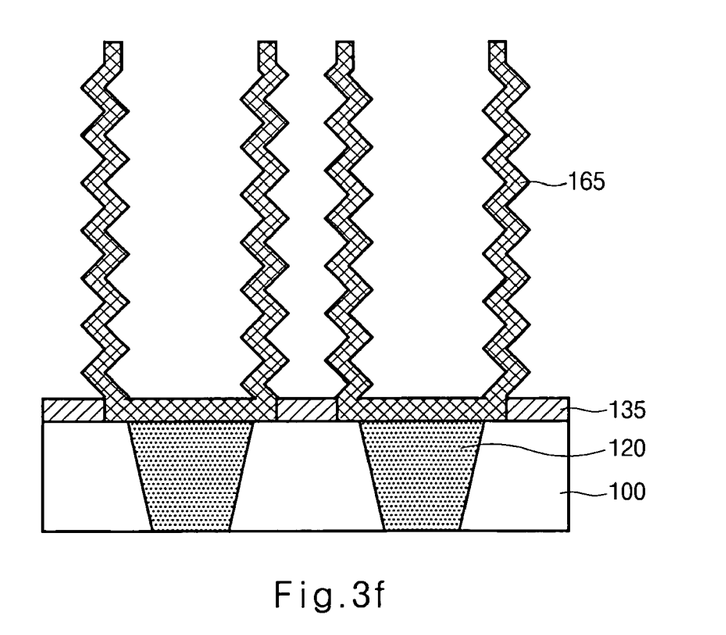

Referring to FIG. 3f, the CHEMICAL MECHANICAL POLISHING process is performed to separate the storage electrode contact plug from the storage electrode 165. The CHEMICAL MECHANICAL POLISHING process is performed until the second polysilicon pattern 155 is exposed. Then, the first and second polysilicon patterns 145 and 155 are removed to complete the storage electrode 165.

Figure 3G:
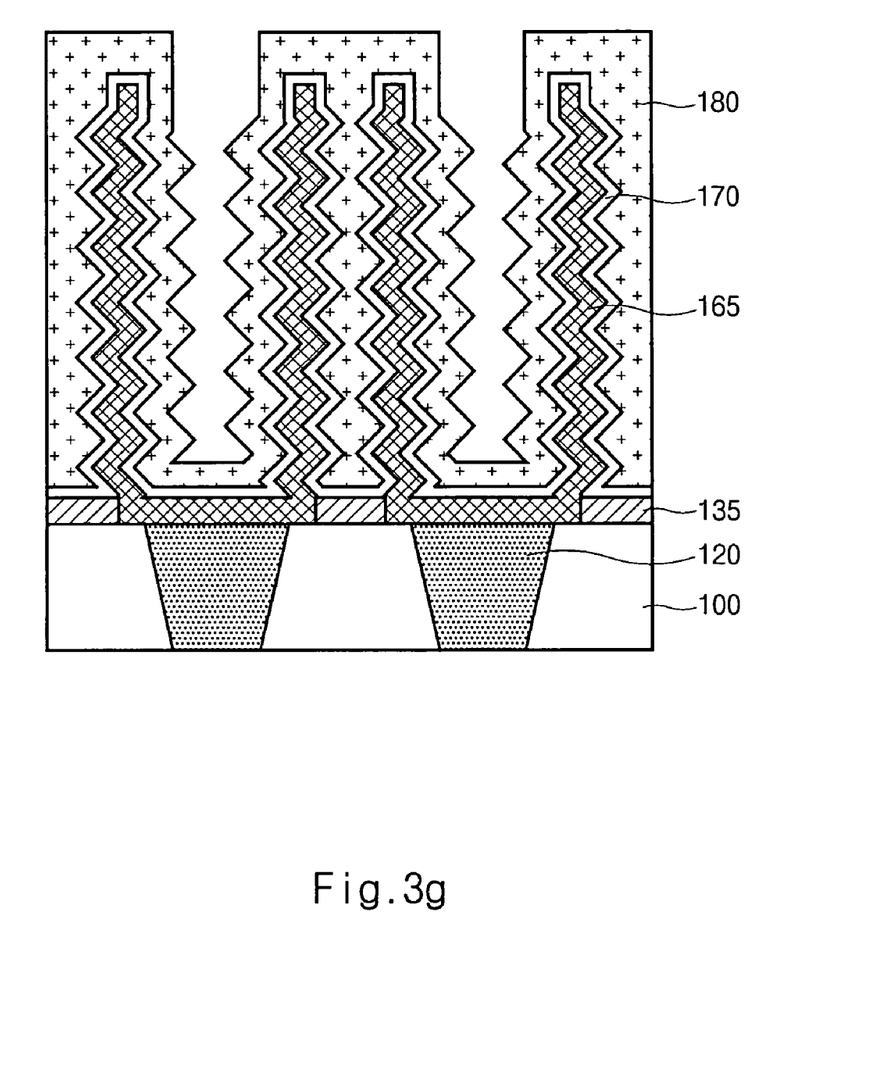

Referring to FIG. 3g, a dielectric layer 170 and a top electrode layer 180 are formed over the semiconductor substrate. The dielectric layer is formed of one selected from a group consisting of $ZrO_2/Al_2O_3/ZrO_2$, BST, SBT and combinations thereof, and the top electrode layer is formed of one metal selected from a group consisting of a group consisting of TiN, Ru, Pt and combinations thereof.

As described above, in a semiconductor device and a method for manufacturing the same according to an embodiment of the present invention, a MPS process is performed on a first polysilicon pattern that defines a storage electrode region in a METAL-INSULATOR-METAL-structured capacitor so that the MPS process can be performed even in a METAL-INSULATOR-METAL structure using a metal electrode. As a result, the height of the first polysilicon layer used as a sacrificial layer is not extremely increased, thereby preventing the collapse of the storage electrode and performing a stable capacitor formation process to increase the yield of semiconductor devices and improve characteristics of the capacitor without introducing new materials having an excellent dielectric constant.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor devices. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming a storage electrode contact plug surrounded by an interlayer insulating film;
    forming an etching barrier film over the interlayer insulating film;
    forming an un-doped polysilicon layer over the etching barrier film;
    forming a doped polysilicon layer over the un-doped polysilicon layer;
    etching a portion of the doped polysilicon layer, the un-doped polysilicon layer and the etching barrier film to define a storage electrode region and to expose a top surface of the storage electrode contact plug;

performing a Meta-stable Poly Silicon (MPS) process so that each of exposed sidewalls of the un-doped polysilicon layer is formed to be concavo-concave;

forming a metal storage electrode layer on the semiconductor substrate, the exposed sidewalls of the un-doped polysilicon layer and the doped polysilicon layer, wherein the metal storage electrode layer is directly contacted the exposed sidewalls of the un-doped polysilicon layer and the doped polysilicon layer;

performing a chemical mechanical polishing (CMP) process on the metal storage electrode layer until a top surface of the doped polysilicon layer is exposed, wherein the remaining metal storage electrode layer forms a storage electrode and directly connected to the storage electrode contact plug;

removing the remaining of the doped polysilicon layer and the un-doped polysilicon layer;

forming a dielectric layer on the storage electrode and the etching barrier film; and forming a metal top electrode layer on the dielectric layer.

2. The method according to claim 1, wherein the etching barrier film is formed of a nitride film.

3. The method according to claim 2, wherein the etching barrier film is formed of the nitride film having a thickness ranging from 300 to 600 Å.

4. The method according to claim 1, wherein the un-doped polysilicon layer has a thickness ranging from 14000 to 20000 Å.

5. The method according to claim 1, wherein the doped polysilicon layer has a thickness ranging from 2000 to 3000 Å.

6. The method according to claim 1, wherein the MPS process is performed until a surface area of each of the exposed sidewalls of the un-doped polysilicon layer is increased by 1.5-2.0 times.

7. The method according to claim 1, wherein the top electrode layer is formed of one metal selected from a group consisting of TiN, Ru, Pt and combinations thereof.

8. A method for manufacturing a semiconductor device, the method comprising:

forming an interlayer insulating film including a storage electrode contact plug;

forming an etching barrier film over the interlayer insulating film;

forming a first polysilicon layer over the etching barrier film, wherein the first polysilicon layer comprises un-doped polysilicon;

forming a second polysilicon layer over the first polysilicon layer, wherein the second polysilicon layer comprises doped polysilicon;

etching a portion of the first and second polysilicon layers and the etching barrier film to define a storage electrode region and to expose a top surface of the storage electrode contact plug;

performing an annealing process in a high vacuum state after seeding of silicon over each of exposed sidewalls of the first polysilicon layer to form a first polysilicon pattern on the exposed sidewalls of the first polysilicon layer;

forming a metal storage electrode layer on the semiconductor substrate, the exposed sidewalls of the first polysilicon pattern and the second polysilicon layer, wherein the metal storage electrode layer is directly contacted the exposed sidewalls of the un-doped polysilicon layer and the doped polysilicon layer;

performing a CMP process on the metal storage electrode layer until a top surface of the second polysilicon layer is exposed, wherein the remaining metal storage electrode layer forms a storage electrode and directly connected to the storage electrode contact plug;

removing the remaining of the first polysilicon layer and the second polysilicon layer;

forming a dielectric layer on the storage electrode and the etching barrier film; and forming a metal top electrode layer on the dielectric layer.

9. The method according to claim 8, wherein the annealing process is performed until a surface area of the first polysilicon pattern is increased by 1.5~2.0 times.

* * * * *